United States Patent [19]

Cheng

[11] Patent Number: 5,386,626
[45] Date of Patent: Feb. 7, 1995

[54] METHOD FOR MANUFACTURING A CIRCUIT BOARD WITH A PLURALITY OF CONDUCTIVE TERMINAL PINS

[75] Inventor: Hing-Liang Cheng, Taipei, Taiwan, Prov. of China

[73] Assignee: Cen Tronic Co., Ltd., Taipei, Taiwan, Prov. of China

[21] Appl. No.: 118,715

[22] Filed: Sep. 10, 1993

[51] Int. Cl.$^6$ ............................................... H05K 3/00
[52] U.S. Cl. ........................................ 29/843; 29/739; 29/DIG. 46; 228/180.22; 228/212
[58] Field of Search .................. 29/842, 843, 884, 739, 29/DIG. 46; 174/267; 228/180.22, 212

[56] References Cited

U.S. PATENT DOCUMENTS

| | | | |
|---|---|---|---|
| 3,667,103 | 6/1972 | Petree | 29/DIG. 46 |
| 3,736,651 | 6/1973 | Law et al. | 29/739 |
| 4,089,105 | 5/1978 | Yeo et al. | 29/739 |
| 4,386,464 | 6/1983 | Yanai et al. | 29/740 |
| 5,211,324 | 5/1993 | Fiedler | 228/212 |

FOREIGN PATENT DOCUMENTS 3181192  8/1991  Japan .................................. 29/843

*Primary Examiner*—P. W. Echols
*Attorney, Agent, or Firm*—Oblon, Spivak, McClelland, Maier & Neustadt

[57] ABSTRACT

A method for manufacturing a circuit board with a plurality of conductive terminal pins includes the steps of: providing a bed with an array of receiving holes formed therein; providing the bed on a vibrating apparatus; placing a plurality of conductive terminal pins on the bed, each of the terminal pins having a shank and an enlarged head; operating the vibrating apparatus to permit insertion of the shank of each of the terminal pins into a respective one of the receiving holes, the enlarged heads of the terminal pins being sized to prevent extension thereof in the respective one of the receiving holes; providing a fiber glass reinforcing plate formed with an array of through-holes; providing a fiber glass circuit board body having a bottom side formed with an array of connectors; superimposing the reinforcing plate and the circuit board body on the bed such that each of the connectors of the circuit board body and the heads of the terminal pins extend in a corresponding one of the through-holes and abut against each other; and heating the bed, the reinforcing plate and the circuit board body under pressure so as to provide a firm bond between the reinforcing plate and the circuit board body and between each of the connectors and the head of a corresponding one of the terminal pins.

7 Claims, 5 Drawing Sheets

METHOD FOR MANUFACTURING A CIRCUIT BOARD WITH A PLURALITY OF CONDUCTIVE TERMINAL PINS

BACKGROUND OF THE INVENTION

1. Field Of The Invention

This invention relates to a method for manufacturing a circuit board with a plurality of conductive terminal pins, more particularly to an economical method for manufacturing a high quality circuit board with a plurality of conductive terminal pins.

2. Description Of The Related Art

Presently, there are many methods available for manufacturing a circuit board with a plurality of conductive terminal pins. However, the conventional methods require expensive manufacturing facilities and complicated manufacturing processes, thereby increasing the cost of the finished product. Furthermore, the products obtained from the conventional methods are either very thick or not durable. Referring to FIG. 1, a conventional circuit board includes a base 11 and a circuit board member 12. An array of conductive terminal pins 13 are mounted securely on the base 11. The base 11 is then connected securely to the circuit board member 12 by welding. Since the base 11 is made of an engineering plastic material while the circuit board member 12 is made of a fiber glass material, the circuit board bends, as shown in FIG. 2, due to differences in the properties of the engineering plastic material and the fiber glass material when the circuit board is passed through a heating furnace (not shown). This can hinder welding of another electrical component on the circuit board and can result in cold weld. Furthermore, the conventional circuit board is relatively thick due to the use of two different materials, thereby preventing the use of the circuit board in a thin electronic product.

Referring now to FIG. 3, another conventional circuit board with a plurality of conductive terminal pins is shown to include a circuit board member 15 to which an array of conductive terminal pins 14 are welded directly. The drawback of this kind of conventional circuit board is that it is not durable since it can only bear relatively weak insertion and extraction forces. Furthermore, the circuit board requires expensive facilities and delicate manufacturing processes to produce the same, thereby increasing the cost of the circuit board. Another drawback of this conventional circuit board is that the terminal pins 14 sometimes fall from the circuit board member 15, and will be displaced and deflected when an electronic part 16 is connected securely to the surface of the circuit board member 15 by means of a surface mounting technique.

SUMMARY OF THE INVENTION

Therefore, the main object of the present invention is to provide a relatively simple and economical method for manufacturing a circuit board with a plurality of conductive terminal pins.

The second object of the present invention is to provide a method for manufacturing a high quality durable circuit board with a plurality of conductive terminal pins.

According to this invention, a method for manufacturing a circuit board with a plurality of conductive terminal pins includes the steps of: providing a bed with an array of receiving holes formed therein; providing the bed on a vibrating apparatus; placing a plurality of conductive terminal pins on the bed, each of the terminal pins having a shank and an enlarged head; operating the vibrating apparatus to permit insertion of the shank of each of the terminal pins into a respective one of the receiving holes, the enlarged head of each of the terminal pins being sized to prevent extension thereof in the respective one of the receiving holes; providing a fiber glass reinforcing plate formed with an array of through-holes; providing a fiber glass circuit board body having a bottom side formed with an array of connectors; superimposing the reinforcing plate and the circuit board body on the bed such that each of the connectors of the circuit board body and the head of each of the terminal pins extend in a corresponding one of the through-holes and abut against each other; and heating the bed, the reinforcing plate and the circuit board body under pressure so as to provide a firm bond between the reinforcing plate and the circuit board body and between each of the connectors and the head of a corresponding one of the terminal pins.

BRIEF DESCRIPTION OF THE DRAWINGS

Other features and advantages of the present invention will become apparent in the following detailed description of the preferred embodiment, with reference to the accompanying drawings, of which.

DETAILED DESCRIPTION OF THE PREFERRED EMBODIMENT

Figure 1:
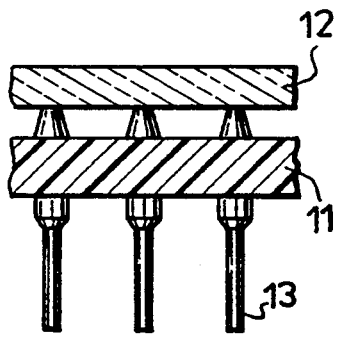
FIG. 1 is a sectional view showing a conventional circuit board with a plurality of conductive terminal pins.
Figure 2:
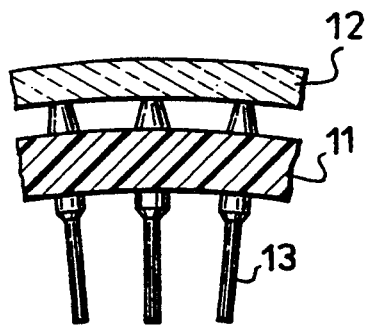
FIG. 2 is a sectional view showing the deformation of the conventional circuit board shown in FIG. 1.
Figure 3:
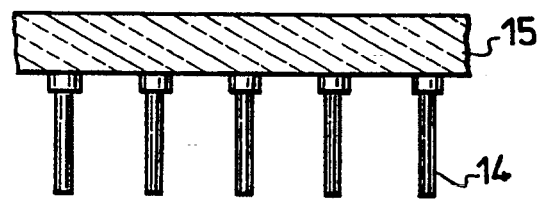
FIG. 3 is a sectional view showing another conventional circuit board with a plurality of conductive terminal pins.
Figure 4:
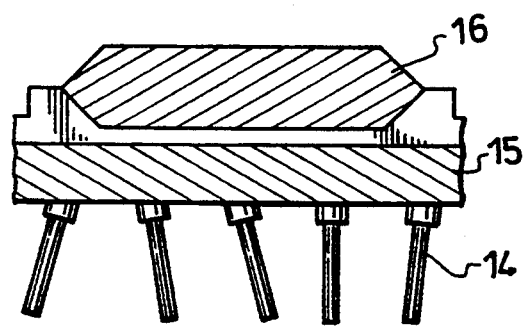
FIG. 4 is a sectional view illustrating the deflection of the terminal pins of the conventional circuit board shown in FIG. 3.
Figure 5:
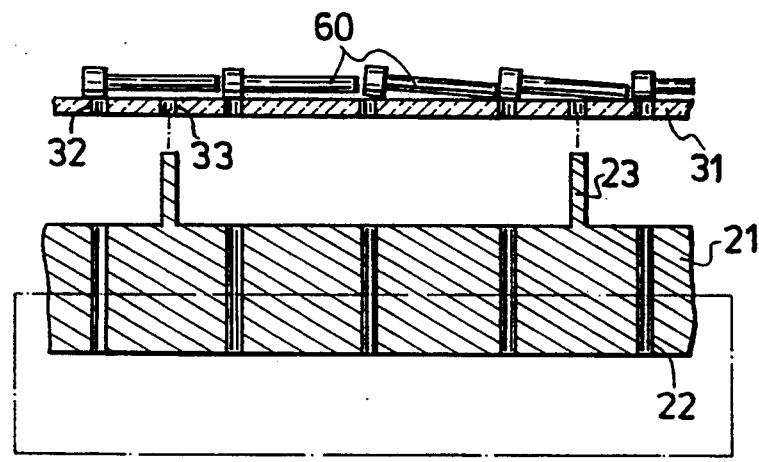
FIG. 5 is an exploded sectional view showing a part of a circuit board manufactured by a method according to the present invention.
Figure 6:
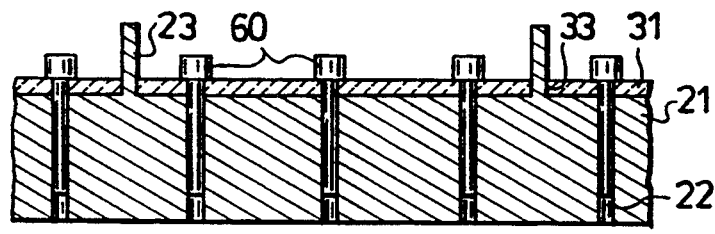
FIG. 6 is a sectional view showing the assembly of the part of the circuit board in FIG. 5.

Referring to FIG. 5, a first bed 21 is provided on a conventional vibrating apparatus (shown in phantom lines). The first bed 21 is formed with an array of first receiving holes 22 therein, and has a top surface which is formed with a plurality of positioning projections 23. A fiber glass positioning plate 31 is provided on top of the first bed 21 and is formed with an array of second receiving holes 32 that are aligned with the first receiving holes 22 in the first bed 21. The positioning plate 31 has a plurality of first positioning holes 33 formed therein. The projections 23 of the first bed 21 extend through a corresponding one of the first positioning holes 33 so as to position the positioning plate 31 on the first bed 21. A plurality of conductive terminal pins 60 are placed indiscriminately on the positioning plate 31. Each of the terminal pins 60 has an enlarged head and a shank. The vibrating apparatus is then operated to permit insertion of the shank of each of the terminal pins 60 into a respective one of the first receiving holes 22 in the first bed 21 via a corresponding one of the second receiving holes 32 in the positioning plate 31, as shown in FIG. 6. The enlarged head of each of the terminal pins 60 is sized to prevent extension of the latter in the corresponding one of the second receiving holes 32.

Figure 7:
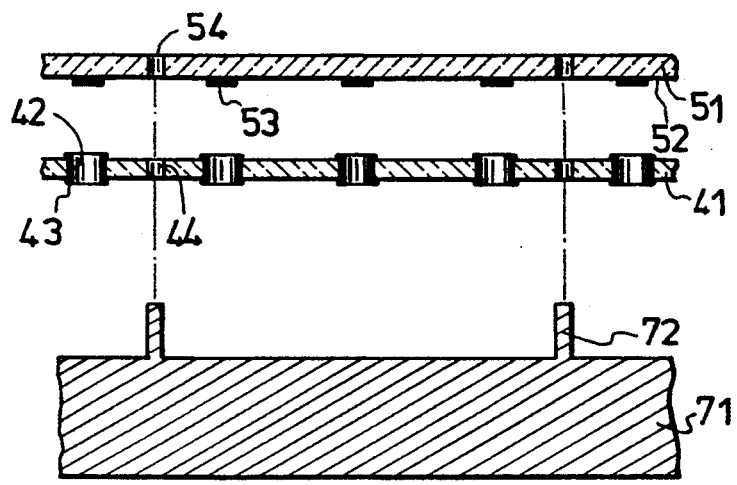
FIG. 7 is an exploded sectional view showing another part of the circuit board manufactured by the method according to the present invention.

Referring now to FIG. 7, a second bed 71 is provided. The second bed 71 has a top surface formed with a plurality of positioning rods 72. A fiber glass reinforcing plate 41 is provided on the second bed 71 and is formed with an array of through-holes 42. The reinforcing plate 41 has a plurality of second positioning holes 44 formed therein. The positioning rods 72 of the second bed 71 extend through a corresponding one of the second positioning holes 44 so as to position the reinforcing plate 41 on the second bed 71. A copper foil 43 is provided on an inner wall of each of the through-holes 42 of the reinforcing plate 41. The reinforcing plate 41 has a top face which is sprayed with welding tin on a periphery defining each of the through-holes 42.

Figure 8:
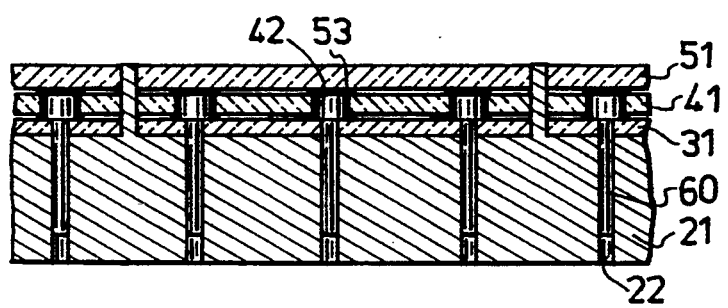
FIG. 8 is a sectional view showing the assembly of the another part of the circuit board in FIG. 7.
Figure 9:
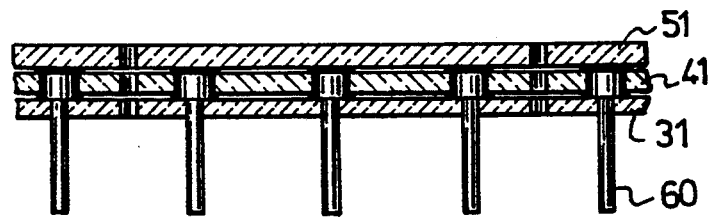
FIG. 9 is a sectional view showing the assembly of the circuit board.

A circuit board body 51 is provided on the reinforcing plate 41 and has a bottom side formed with an array of connectors 53. Each of the connectors 53 is covered with a layer of tin paste. The circuit board body 51 further has a plurality of third positioning holes 54 formed therein. The positioning rods 72 of the second bed 71 extend through a corresponding one of the third positioning holes 54 so as to position the circuit board body 51 on the reinforcing plate 41. The reinforcing plate 41 and the circuit board body 51 are then removed from the second bed 71 and are placed on the positioning plate 31, as shown in FIG. 8, such that each of the connectors 53 of the circuit board body 51 and the enlarged heads of the terminal pins 60 extend in the corresponding one of the through-holes 42 in the reinforcing plate 41 and abut against each other. The first bed 21, the positioning plate 31, the reinforcing plate 41 and the circuit board 51 are then heated to the melting point of the tin paste and the welding tin under pressure so as to provide a firm bond between the reinforcing plate 41 and the circuit board body 51 and between each of the connectors 53 and the enlarged head of a corresponding one of the terminal pins 60. The completed circuit board is then removed from the first bed 21, as shown in FIG. 9.

Figure 10:
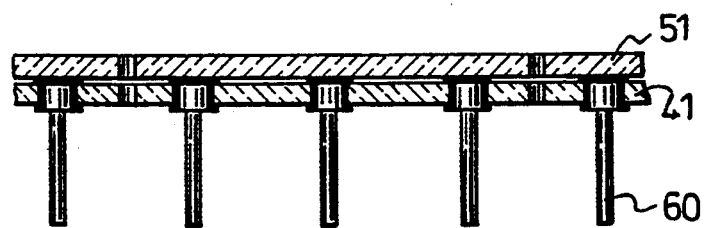
FIG. 10 is a sectional view showing another circuit board manufactured by the method according to the present invention.

It is worthwhile to notice that the circuit board may be manufactured without the positioning plate 31, as illustrated in FIG. 10. If such is the case, the terminal pins 60' are placed directly on the first bed, and the vibrating apparatus is operated so that the shank of each of the pins 60' are inserted into the first receiving holes in the first bed.

The advantages of the present invention are as follows:

1. The manufacturing process is simple and easy, and does not require the use of expensive manufacturing facilities, thereby reducing the cost of the circuit board while increasing the production rate.
2. A circuit board made with the use of the method of the present invention is relatively thin (about 1.6 mm) and is ideal for use in thin electronic products. A conventional circuit board has a thickness of about 7 to 8 mm.
3. The incorporation of the reinforcing plate 41 can enhance durability of the circuit board by increasing the insertion and extraction forces of the terminal pins 60.
4. Since the circuit board body, the reinforcing plate and the positioning plate are all made of the same material, the circuit board does not bend when heated.
5. The heating time is shorter (from about ten minutes reduced to about ten seconds) so as to prevent the damage to the circuit board due to high temperature.

While the present invention has been described in connection with what is considered the most practical and preferred embodiment, it is understood that this invention is not limited to the disclosed embodiment, but is intended to cover various arrangements included within the spirit and scope of the broadest interpretation so as to encompass all such modifications and equivalent arrangements.

I claim:

1. A method for manufacturing a circuit board with a plurality of conductive terminal pins, said method comprising the steps of:
    (a) providing a first bed with an array of first receiving holes formed therein;
    (b) providing said first bed on a vibrating apparatus;
    (c) placing a plurality of conductive terminal pins on said first bed, each of said terminal pins having a shank and an enlarged head;
    (d) operating said vibrating apparatus to permit insertion of said shank of each of said terminal pins into a respective one of said first receiving holes in said first bed, said enlarged head of said each of said terminal pins being sized larger than said first receiving holes;
    (e) providing a fiber glass reinforcing plate formed with an array of through-holes;
    (f) providing a fiber glass circuit board body having a bottom side formed with an array of connectors;
    (g) superimposing said reinforcing plate and said circuit board body on said first bed such that each of said connectors of said circuit board body and said head of said each of said terminal pins extend in a corresponding one of said through-holes in said reinforcing plate and abut against each other; and
    (h) heating said first bed, said reinforcing plate and said circuit board body under pressure so as to provide a firm bond between said reinforcing plate and said circuit board body and between each of said connectors and said head of a corresponding one of said terminal pins.

2. A method for manufacturing a circuit board with a plurality of conductive terminal pins as claimed in claim 1, further comprising, prior to step (c), a step (b') of providing a positioning plate on top of said first bed, said positioning plate being formed with an array of second receiving holes aligned with said first receiving holes in said first bed, said terminal pins being placed on top of said positioning plate.

3. A method for manufacturing a circuit board with a plurality of conductive terminal pins as claimed in claim 2, wherein said first bed has a top surface formed with a plurality of positioning projections, said positioning plate further having a plurality of first positioning holes formed therein, said step (b') comprising the step of extending said positioning projections of said first bed through a corresponding one of said first positioning holes so as to position said positioning plate on said first bed.

4. A method for manufacturing a circuit board with a plurality of conductive terminal pins as claimed in claim 1, further comprising, prior to step (g), a step (e1) of providing a copper foil on an inner wall of each of said through-holes of said reinforcing plate.

5. A method for manufacturing a circuit board with a plurality of conductive terminal pins as claimed in claim 4, further comprising, after step (e1), a step (e2) of spraying a top face of said reinforcing plate with welding tin on a periphery defining each of said through-holes.

6. A method for manufacturing a circuit board with a plurality of conductive terminal pins as claimed in claim 1, further comprising, prior to step (g), a step (f1) of covering each of said connectors with a layer of tin paste.

7. A method for manufacturing a circuit board with a plurality of conductive terminal pins as claimed in claim 1, wherein said step (g) comprises the steps of:

(g1) providing a second bed which has a top surface formed with a plurality of positioning rods;

(g2) providing said reinforcing plate on said second bed, said reinforcing plate having a plurality of second positioning holes formed therein, said positioning rods of said second bed extending through a corresponding one of said second positioning holes so as to position said reinforcing plate on said second bed;

(g3) positioning said circuit board body on said reinforcing plate, said circuit board body having a plurality of third positioning holes formed therein, said positioning rods of said second bed extending through a corresponding one of said third positioning holes so as to position said circuit board body on said reinforcing plate; and (g4) removing said reinforcing plate and said circuit board body from said second bed and placing said circuit board body and said reinforcing plate on said first bed.

* * * * *